(12) United States Patent
Park (10) Patent No.: US 11,762,255 B2
(45) Date of Patent: Sep. 19, 2023

(54) MASK INCLUDING FIRST REFRACTIVE MEMBER THAT CONCENTRATES FIRST LIGHT AND SECOND REFRACTIVE MEMBER THAT DISPERSES SECOND LIGHT

(71) Applicant: Samsung Display Co., Ltd., Yongin-Si (KR)

(72) Inventor: Hyunggyu Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 56 days.

(21) Appl. No.: 17/343,653

(22) Filed: Jun. 9, 2021

(65) Prior Publication Data

US 2022/0171246 A1 Jun. 2, 2022

(30) Foreign Application Priority Data

Dec. 1, 2020 (KR) ........................ 10-2020-0165946

(51) Int. Cl.
| | | |
|---|---|---|
| G02F 1/155 | (2006.01) | |
| G02F 1/1343 | (2006.01) | |
| G02F 1/157 | (2006.01) | |
| G03F 1/62 | (2012.01) | |
| G03F 1/38 | (2012.01) | |
| H10K 71/00 | (2023.01) | |
| H10K 71/20 | (2023.01) | |
| H10K 59/12 | (2023.01) | |

(52) U.S. Cl.
CPC .......... *G02F 1/155* (2013.01); *G02F 1/13439* (2013.01); *G02F 1/157* (2013.01); *G03F 1/38* (2013.01); *G03F 1/62* (2013.01); *H10K 71/00* (2023.02); *H10K 71/233* (2023.02); *H10K 59/12* (2023.02)

(58) Field of Classification Search
None
See application file for complete search history.

(56) References Cited

U.S. PATENT DOCUMENTS

| | | | | |
|---|---|---|---|---|
| 5,189,549 A | * | 2/1993 | Leventis | F21K 2/08 359/268 |
| 2005/0112478 A1 | * | 5/2005 | Taravade | G03F 1/34 430/5 |
| 2013/0316269 A1 | * | 11/2013 | Ye | G03F 1/46 430/5 |
| 2014/0127612 A1 | * | 5/2014 | Kang | G03F 1/38 430/5 |
| 2016/0266483 A1 | * | 9/2016 | Van Setten | G03F 7/70433 |
| 2017/0133592 A1 | * | 5/2017 | Baek | H01L 51/56 |
| 2018/0004082 A1 | * | 1/2018 | Song | G03F 1/62 |
| 2018/0314147 A1 | * | 11/2018 | Ma | G02F 1/155 |
| 2019/0018315 A1 | * | 1/2019 | Liang | H01L 27/124 |

FOREIGN PATENT DOCUMENTS

| | | |
|---|---|---|
| KR | 10-2008-0110468 A | 12/2008 |
| KR | 10-1188434 B1 | 10/2012 |
| KR | 10-2083947 B1 | 4/2020 |

* cited by examiner

*Primary Examiner* — Ryan Crockett
(74) *Attorney, Agent, or Firm* — Innovation Counsel LLP (57) ABSTRACT

A mask includes a substrate and an electrochromic layer that overlap each other. The electrochromic layer includes an electrochromic material.

14 Claims, 9 Drawing Sheets

MASK INCLUDING FIRST REFRACTIVE MEMBER THAT CONCENTRATES FIRST LIGHT AND SECOND REFRACTIVE MEMBER THAT DISPERSES SECOND LIGHT

CROSS-REFERENCE TO RELATED APPLICATION

This application claims priority under 35 U.S.C. § 119 to Korean Patent Application No. 10-2020-0165946, filed on Dec. 1, 2020, in the Korean Intellectual Property Office; the Korean Patent Application is incorporated by reference.

BACKGROUND

1. Field

The technical field relates to a mask, e.g., a photomask.

2. Description of the Related Art

A modern display apparatus (such as an organic light-emitting display apparatus or a liquid crystal display apparatus) typically includes thin film transistors for controlling electric currents. Multiple masks may be required for forming the transistors.

SUMMARY

One or more embodiments may be related to a mask for forming a thin film transistor, a storage capacitor, and/or wires.

According to an embodiment, a mask includes a substrate and an electrochromic layer under the substrate, the electrochromic layer including an electrochromic material.

The mask may further include a first electrode between the substrate and the electrochromic layer, wherein the first electrode is under the substrate and has a mesh shape.

The first electrode may be in direct contact with the electrochromic layer.

The electrochromic layer may transmit or block incident light.

The mask may further include a refractive layer under the electrochromic layer.

The refractive layer may include a first material and a second material, the first material having a first refractive index and the second material having a second refractive index that is different from the first refractive index.

The refractive layer may concentrate or disperse light that has passed through the electrochromic layer.

The mask may further include a barrier wall surrounding at least a part of the refractive layer.

The mask may further include a second electrode under the electrochromic layer, wherein the first electrode and the second electrode may each include a transparent electrode.

The mask may further include a pellicle surrounding the second electrode.

The pellicle may be separated from the second electrode.

According to an embodiment, a mask includes a substrate, a refractive layer under the substrate, the refractive layer including a first material having a first refractive index and a second material having a second refractive index that is different from the first refractive index, and a barrier wall surrounding at least a part of the refractive layer.

The mask may further include an electrochromic layer between the substrate and the refractive layer, the electrochromic layer including an electrochromic material.

The electrochromic layer may transmit or block incident light.

The refractive layer may concentrate or disperse light that has passed through the electrochromic layer.

The mask may further include a first electrode between the substrate and the electrochromic layer, and a second electrode under the refractive layer.

The first electrode and the second electrode may each include a transparent electrode.

The first electrode may be in direct contact with the electrochromic layer.

The mask may further include a pellicle surrounding the second electrode.

The pellicle may be separated from the second electrode.

An embodiment may be related to a mask (e.g., a photomask). The mask may include a substrate and an electrochromic layer that includes an electrochromic material. The substrate and the electrochromic layer may overlap each other.

The mask may include a first electrode positioned between the substrate and the electrochromic layer. The first electrode may have a mesh structure.

The first electrode may directly contact the electrochromic layer.

The electrochromic layer may include a first electrochromic member and a second electrochromic member that are equidistant from the substrate. The first electrochromic member may transmit a first portion of incident light. The second electrochromic member may block a second portion of the incident light.

The mask may include a refractive layer. The electrochromic layer may be positioned between the substrate and the refractive layer.

The refractive layer may include a first material and a second material. The first material, the second material, and the substrate may overlap each other. The first material may have a first refractive index. The second material may have a second refractive index unequal to the first refractive index.

The refractive layer may include a first refractive member and a second refractive member that are equidistant from the substrate. The first refractive member may concentrate first light that has passed through the electrochromic layer. The second refractive member may disperse second light that has passed through the electrochromic layer.

The mask may include a barrier wall surrounding at least a part of the refractive layer.

The mask may include a second electrode. The electrochromic layer may be positioned between the first electrode and the second electrode. The first electrode may include a first transparent electrode. The second electrode may include a second transparent electrode.

The mask may include a pellicle surrounding the second electrode.

The pellicle may be spaced from the second electrode.

An embodiment may be related to a mask (e.g., a photomask). The mask may include a substrate, a refractive member, and a barrier wall. The refractive layer may include a first material and a second material. The first material, the second material, and the substrate may overlap each other. The first material may have a first refractive index. The second material may have a second refractive index unequal to the first refractive index. The barrier wall may surround at least a part of the refractive layer.

The mask may include an electrochromic layer positioned between the substrate and the refractive layer and including an electrochromic material.

The electrochromic layer may include a first electrochromic member and a second electrochromic member that are equidistant from the substrate. The first electrochromic member may transmit a first portion of incident light. The second electrochromic member may block a second portion of the incident light.

The refractive layer may include a first refractive member and a second refractive member that are equidistant from the substrate. The first refractive member may concentrate first light that has passed through the electrochromic layer. The second refractive member may disperse second light that has passed through the electrochromic layer.

The mask may include a first electrode positioned between the substrate and the electrochromic layer. The mask may include a second electrode. The refractive layer may be positioned between the first electrode and the second electrode.

The first electrode may include a first transparent electrode. The second electrode may include a second transparent electrode.

The first electrode may directly contact the electrochromic layer.

The mask may include a pellicle surrounding the second electrode.

The pellicle may be spaced from the second electrode.

DETAILED DESCRIPTION

Example embodiments are described with reference to the accompanying drawings, wherein like reference numerals may refer to like elements. Practical embodiments may have different forms and should not be construed as being limited to the example embodiments.

While the terms "first," "second," etc. may be used to describe various elements, these elements should not be limited by the terms. The terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

An expression used in the singular form may encompass the expression of the plural form.

The terms "including," "having," and "comprising" may indicate the existence of the stated features and may not preclude one or more other features.

The term "on" may mean "directly on" (with no intervening elements) or "indirectly on" (with one or more intervening elements).

Dimensions in the drawings may be exaggerated for convenience of explanation.

If an element is described as "extending in a specified direction," the lengthwise direction of the element is (in) the specified direction.

The term "connected" may mean "electrically connected" or "electrically connected through no intervening transistor." The term "insulate" may mean "electrically insulate" or "electrically isolate." A listing of (applicable) materials/methods/features may mean at least one of the listed (applicable) materials/methods/features.

Figure 1:
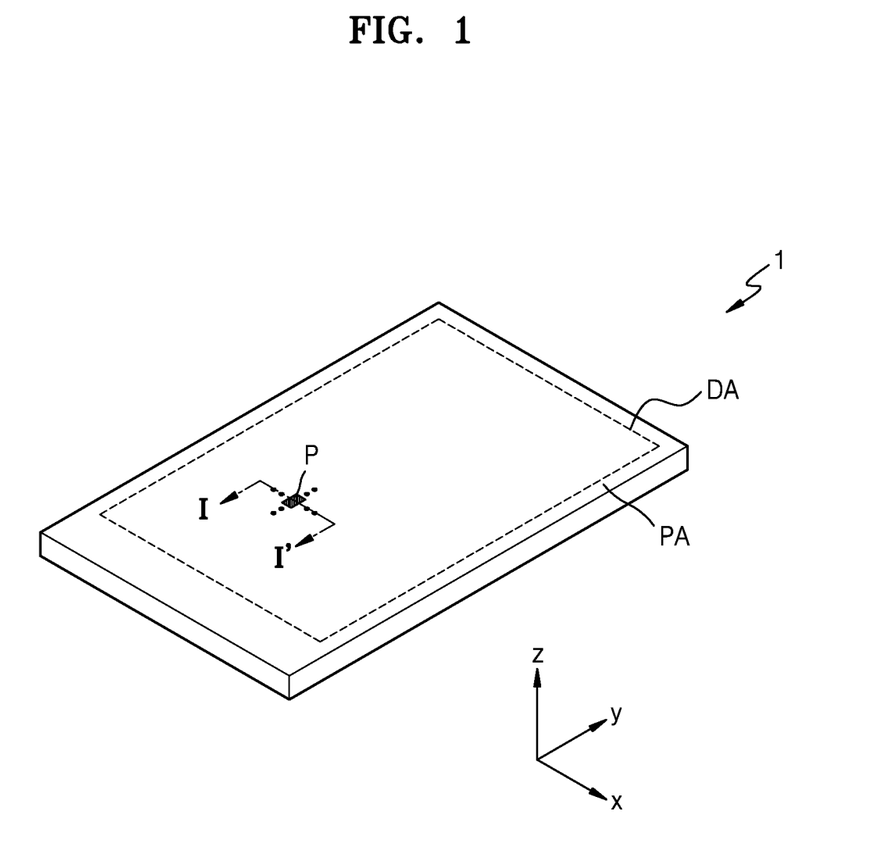
FIG. 1 is a perspective view of a display apparatus according to an embodiment.

FIG. 1 is a perspective view of a display apparatus 1 according to an embodiment.

Referring to FIG. 1, the display apparatus 1 may include a display area DA and a peripheral area PA neighboring the display area DA. The peripheral area PA may surround the display area DA. The display device 1 may display images according to input signals using light emitted from pixels P in the display area DA. The peripheral area PA may not display images according to input signals.

The display apparatus 1 may be/include an organic light-emitting display apparatus, an inorganic light-emitting display (or an inorganic EL display apparatus), or a quantum dot light-emitting display apparatus. For example, a light-emitting layer of a display element included in the display apparatus 1 may include an organic material, an inorganic material, quantum dots, an organic material and quantum dots, or an inorganic material and quantum dots.

The display apparatus 1 may have a flat display surface, a three-dimensional display surface, and/or a curved display surface.

When the display apparatus 1 includes a three-dimensional display surface, e.g., a polyprism-type display surface, the display apparatus 1 includes a plurality of display areas directed differently. When the display apparatus 1 includes a curved display surface, the display apparatus 1 may be/include one or more of a flexible display apparatus, a foldable display apparatus, a rollable display apparatus, etc.

The display apparatus 1 may be applied to a mobile terminal. The mobile terminal may include electronic modules, a camera module, a power module, etc. mounted on a main board in a bracket/case together with the display apparatus 1. The display apparatus 1 may be applied to a large-sized electronic apparatus such as a television or a monitor. The display apparatus 1 may be applied to a small-medium size electronic apparatus such as a tablet terminal, a car navigation system, a game console, or a smartwatch.

The display area DA of the display apparatus 1 may have a rectangular shape, a circular shape, an elliptical shape, or a polygonal shape (such as a triangular shape or a pentagonal shape).

The display apparatus 1 includes a plurality of pixels P in the display area DA. Each of the pixels P may include an organic light-emitting diode OLED for emitting red light, green light, blue light, or white light.

Figure 2:
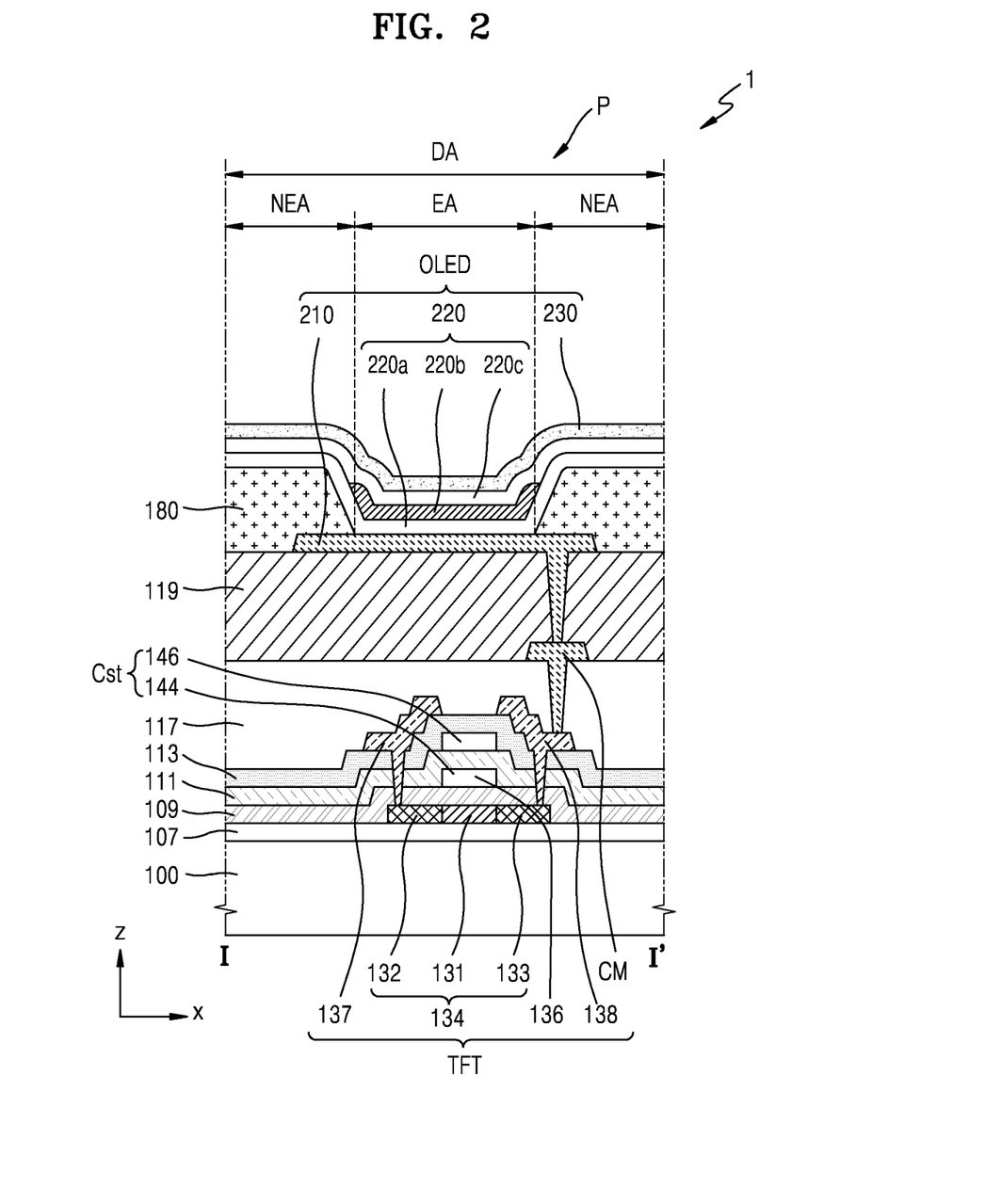
FIG. 2 is a cross-sectional view of a display apparatus according to an embodiment.

FIG. 2 is a cross-sectional view of a pixel P of the display apparatus 1 according to an embodiment. FIG. 2 shows a cross-section of the display apparatus 1 taken along line I-I' of FIG. 1.

Referring to FIG. 2, a display substrate 100 may include a polymer resin. The display substrate 100 including the polymer resin may be flexible, rollable, or bendable. The display substrate 100 may include at least one of polyethersulfone, polyacrylate, polyether imide, polyethylene naphthalate, polyethylene terephthalate, polyphenylene sulfide, polyarylate, polycarbonate, cellulose acetate propionate, etc. The display substrate 100 may include polyimide. For example, the display substrate 100 may include transparent polyimide.

The display substrate 100 may include a first substrate and a second substrate. The first and second substrates may include the same material. For example, the first and second substrates may both include polyimide. The first and second substrates may respectively include different materials.

A buffer layer 107 may be on the display substrate 100. The buffer layer 107 is on the display substrate 100 to reduce or block infiltration of impurities, moisture, or external air from the display substrate 100, and to provide a flat surface on the display substrate 100. The buffer layer 107 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The buffer layer 107 may include silicon oxide ($SiO_2$) or silicon nitride ($SiN_x$). The buffer layer 107 may have a multi-layered structure including silicon oxide ($SiO_x$) and silicon nitride ($SiN_x$).

A thin film transistor TFT may be on the buffer layer 107. The thin film transistor TFT may include a semiconductor layer 134, a gate electrode 136 overlapping the semiconductor layer 134, and a connecting electrode electrically connected to the semiconductor layer 134. The thin film transistor TFT is connected to the organic light-emitting diode OLED to drive the organic light-emitting diode OLED.

The semiconductor layer 134 is on the buffer layer 107, may include a channel region 131 overlapping the gate electrode 136, and may include a source region 132 and a drain region 133 at opposite sides of the channel region 131 and having impurities of higher concentration than that of the channel region 131. The impurities may include N-type impurities or P-type impurities. The source region 132 and the drain region 133 may be electrically connected to the connecting electrode.

The semiconductor layer 134 may include oxide semiconductor and/or silicon semiconductor. When the semiconductor layer 134 includes oxide semiconductor, the semiconductor layer 134 may include an oxide material of at least one of indium (In), gallium (Ga), stannum (Sn), zirconium (Zr), vanadium (V), hafnium (Hf), cadmium (Cd), germanium (Ge), chrome (Cr), titanium (Ti), and zinc (Zn). For example, the semiconductor layer 134 may include ITZO (InSnZnO), IGZO (InGaZnO), etc. When the semiconductor layer 134 includes silicon semiconductor, the semiconductor layer 134 may include, for example, amorphous silicon (a-Si) or low-temperature poly-silicon (LPTS) obtained by crystallizing a-Si.

A first insulating layer 109 may be on the semiconductor layer 134. The first insulating layer 109 may include at least one inorganic insulating material selected from silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO$). The first insulating layer 109 may have a single-layered or a multi-layered structure.

The gate electrode 136 may be on the first insulating layer 109. The gate electrode 136 may have a single or multi-layered structure including one or more metals selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 136 may be connected to a gate line that applies an electrical signal to the gate electrode 136.

A second insulating layer 111 may be on the gate electrode 136. The second insulating layer 111 may include at least one inorganic insulating material selected from silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO$). The second insulating layer 111 may have a single-layered or a multi-layered structure.

The storage capacitor Cst may be on the first insulating layer 109. The storage capacitor Cst may include a lower electrode 144 and an upper electrode 146 overlapping the lower electrode 144. The second insulating layer 111 may be positioned between the lower electrode 144 and the upper electrode 146.

The lower electrode 144 of the storage capacitor Cst overlaps the gate electrode 136 of the thin film transistor TFT, and the lower electrode 144 of the storage capacitor Cst may be integrally provided with the gate electrode 136 of the thin film transistor TFT. The lower electrode 144 of the storage capacitor Cst may be spaced from the gate electrode 136 of the thin film transistor TFT and may be on the first insulating layer 109 as a separate element.

The upper electrode 146 of the storage capacitor Cst may include, for example, aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and/or copper (Cu), and may have a single-layered or multi-layered structure.

A third insulating layer 113 may be on the upper electrode 146 of the storage capacitor Cst. The third insulating layer 113 may include at least one inorganic insulating material selected from silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO$). The third insulating layer 113 may have a single-layered or a multi-layered structure.

A source electrode 137 and a drain electrode 138 that are connecting electrodes may be on the third insulating layer 113. The source electrode 137 and the drain electrode 138 may include a conductive material including at least one of molybdenum (Mo), aluminum (Al), copper (Cu), titanium (Ti), etc., and may have a single-layered or multi-layered structure. The first source electrode 137 and the drain electrode 138 may each have a Ti—Al—Ti multi-layered structure.

The first planarization layer 117 may be on the source electrode 137 and the drain electrode 138. The first planarization layer 117 may include a single-layered or multi-layered structure including an organic material or an inorganic material. The first planarization layer 117 may include a general universal polymer such as benzocyclobutene (BCB), polyimide, hexamethyldisiloxane (HMDSO), polymethylmethacrylate (PMMA), or polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. The first planarization layer 117 may include silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), zinc oxide (ZnO), etc. After arranging the first planarization layer 117, a chemical and mechanical polishing may be performed to provide a flat upper surface.

A contact metal layer CM may be on the first planarization layer 117. The contact metal layer CM may include aluminum (Al), copper (Cu), titanium (Ti), etc. and may have a single-layered or multi-layered structure. The contact metal layer CM may have a multi-layered Ti—Al—Ti structure.

A second planarization layer 119 may be on the contact metal layer CM. The second planarization layer 119 may include a single-layered or multi-layered structure including an organic material or an inorganic material. The second planarization layer 119 may include the same material(s) as that of the first planarization layer 117. The second planarization layer 119 may include a material different from that of the first planarization layer 117. After forming the second planarization layer 119, a chemical and mechanical polishing may be performed to provide a flat upper surface. The second planarization layer 119 may be optional.

The organic light-emitting diode OLED including a pixel electrode 210, an intermediate layer 220, and an opposite electrode 230 may be positioned on the second planarization layer 119. The pixel electrode 210 may be electrically connected to the contact metal layer CM via a contact hole penetrating through the second planarization layer 119, and the contact metal layer CM may be electrically connected to the source electrode 137 or the drain electrode 138 via the contact hole, such that the organic light-emitting diode OLED may be electrically connected to the thin film transistor TFT.

The pixel electrode 210 may be on the second planarization layer 119. The pixel electrode 210 may include a transparent electrode, a semi-transparent electrode, and/or a reflective electrode. The pixel electrode 210 may include a reflective layer including at least one of aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), copper (Cu), and an alloy of some of the above metals, and may include a transparent or semi-transparent electrode layer on the reflective layer. The transparent or semi-transparent electrode layer may include at least one electrode material selected from indium tin oxide (ITO), indium zinc oxide (IZO), zinc oxide (ZnO), indium oxide ($In_2O_3$), indium gallium oxide, and aluminum zinc oxide (AZO). The pixel electrode 210 may include an ITO-Ag-ITO stack structure.

A pixel defining layer 180 may be on the second planarization layer 119, and the pixel defining layer 180 may include an opening at least partially exposing the pixel electrode 210. A region exposed by the opening of the pixel defining layer 180 may be an emission area EA. A periphery of the emission area EA is a non-emission area NEA, and the non-emission area NEA may surround the emission area EA. The display area DA includes a plurality of emission areas EA and includes the non-emission area NEA surrounding the plurality of emission areas EA. The pixel defining layer 180 increases a distance between the pixel electrode 210 and an opposite electrode 230 on the pixel electrode 210 to prevent generation of arcs at the edge of the pixel electrode 210. The pixel defining layer 180 may include an organic insulating material such as polyimide, polyamide, acryl resin, benzo cyclobutene, phenol resin, etc., and may be manufactured by a spin coating method, etc. A spacer (not shown) may be further on the pixel defining layer 180.

The intermediate layer 220 may be on the pixel electrode 210, which is at least partially exposed via the pixel defining layer 180. The intermediate layer 220 may include an emission layer 220b, and may include a first functional layer 220a and a second functional layer 220c under and on the emission layer 220b.

The intermediate layer 220 may direct contact a portion of the pixel electrode 210 exposed through the pixel defining layer 180.

The first functional layer 220a may be under the emission layer 220b, and the second functional layer 220c may be on the emission layer 220b. The first functional layer 220a and the second functional layer 220c may be organic functional layers.

The first functional layer 220a may include a hole injection layer (HIL) and/or a hole transport layer (HTL), and the second functional layer 220c may include an electron transport layer (ETL) and/or an electron injection layer (EIL).

The emission layer 220b may include an organic material including a fluorescent or phosphor material emitting red, green, blue, or white light. The emission layer 220b may include low-molecular weight organic materials or polymer materials.

When the emission layer 220b includes a low-molecular weight organic material, the intermediate layer 220 may include an HIL, an HTL, the emission layer 220b, an ETL, and an EIL in a single or multiple-layered structure, and examples of the low-molecular weight material may include copper phthalocyanine (CuPc), N,N'-Di(naphthalene-1-yl)-N,N'-diphenyl-benzidine (NPB), and tris-8-hydroxyquinoline aluminum ($Alq_3$).

When the emission layer 220b includes a polymer organic material, the intermediate layer 220 may include an HTL and the emission layer 220b. The HTL may include PEDOT, and the emission layer 220b may include a poly-phenylenevinylene (PPV)-based or polyfluorene-based polymer material. The emission layer 220b may be formed using a screen printing method, an inkjet printing method, a laser induced thermal imaging (LITI) method, etc.

The opposite electrode 230 may be on the intermediate layer 220. The opposite electrode 230 is on the intermediate layer 220, and the opposite electrode 230 may entirely cover the intermediate layer 220. The opposite electrode 230 may be on the display area DA and may entirely cover the display area DA. The opposite electrode 230 may be integrally provided throughout the entire display area so as to cover the pixels P in the display area DA by using an open mask.

The opposite electrode 230 may include a conductive material having a low work function. For example, the opposite electrode 230 may include a semi-transparent or transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy of some of the metals. The opposite electrode 230 may include a layer including ITO, IZO, ZnO, or $In_2O_3$ on the semi-transparent or transparent layer.

Figure 3:
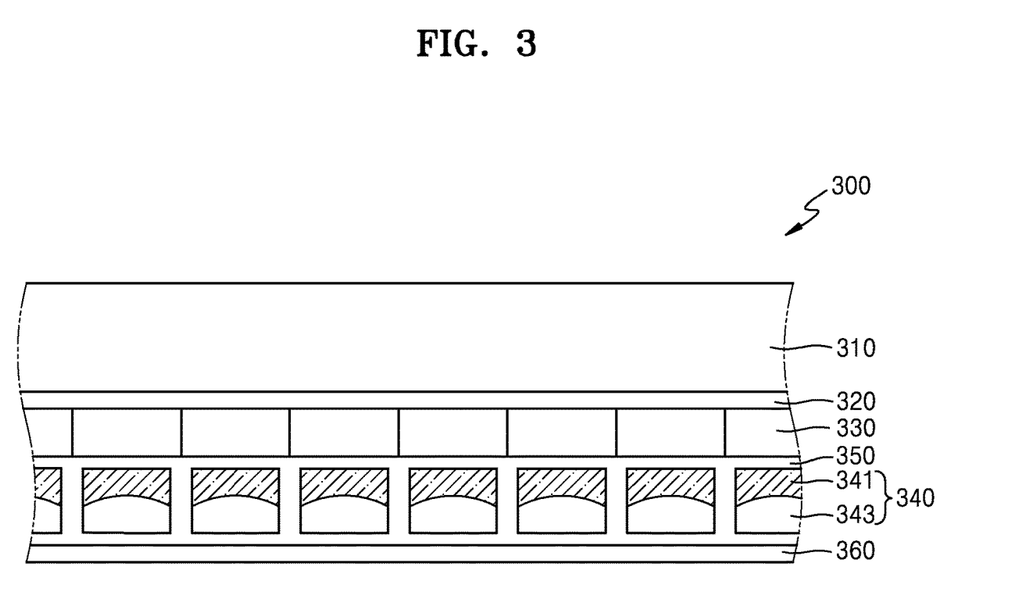
FIG. 3 is a cross-sectional view partially showing a mask according to an embodiment.

FIG. 3 is a cross-sectional view partially showing a mask 300 according to an embodiment. The electrodes such as the gate electrode 136, the upper electrode 146, the source electrode 137, the drain electrode 138, the pixel electrode 210, etc. and contact holes in the first insulating layer 109, the second insulating layer 111, the first planarization layer 117, etc. may be patterned through an exposure process using the mask 300.

Referring to FIG. 3, the mask 300 may include a substrate 310, a first electrode 320, an electrochromic layer 330, a refractive layer 340, a barrier wall 350, and a second electrode 360. The substrate 310 may include quartz glass, etc. The substrate 310 may transmit light. The substrate 310 may be partitioned into a plurality of areas.

The electrochromic layer 330 may be under the substrate 310 during a process of forming elements of the display apparatus 1. The electrochromic layer 330 may be patterned to include areas that respectively correspond to the areas of the substrate 310. The electrochromic layer 330 may be integrally provided without divided areas.

The electrochromic layer 330 may transmit or block incident light, e.g., ultraviolet (UV) light. The electrochromic layer 330 may include an electrochromic material. A phenomenon that a color reversibly changes according to a direction of an electric filed when applying a voltage is referred to as electrochromism, and a material of which an optical property may be changed reversibly according to an electrochemical redox reaction is referred to as an electrochromic material. When no electric field is applied to an electrochromic material, the electrochromic material does not have a color, but when an electric field is applied, the electrochromic material may have the color, or vice versa.

The electrochromic material may include tungsten oxide, nickel oxide, titanium oxide, vanadium oxide, Prussian blue, etc. The electrochromic material may include viologen, polyaniline, Poly(3,4-ethylenedioxythiophene)(PEDOT), etc.

The first electrode 320 may be between the substrate 310 and the electrochromic layer 330. The first electrode 320 may have a mesh structure and/or an array/matrix structure. The voltage may be applied to areas of the electrochromic layer 330 respectively corresponding to the areas of the substrate 310 via the mesh structure of the first electrode 320.

The first electrode 320 may be a transparent electrode. For example, the first electrode 320 may include at least one of indium tin oxide (ITO), indium zinc oxide (IZO), zinc oxide (ZnO), indium oxide ($In_2O_3$), indium gallium oxide (IGO), and aluminum zinc oxide (AZO).

The refractive layer 340 may be under the electrochromic layer 330 during a process of forming elements of the display apparatus 1. The refractive layer 340 may concentrate and/or disperse the light transmitting through the electrochromic layer 330. The refractive layer 340 may include a first material 341 having a first refractive index, and may include a second material 343 having a second refractive index that is different from the first refractive index. The first refractive index of the first material 341 may be greater than the second refractive index of the second material 343. The first refractive index of the first material 341 may be less than the second refractive index of the second material 343.

The first material 341 and the second material 343 may each be provided in a liquid phase. The first material 341 and the second material 343 may not mix with each other. The first material 341 may include a non-polar material, and the second material 343 may include a polar material. For example, the first material 341 may include oil and the second material 343 may include water.

Members of the refractive layer 340 may be surrounded by the barrier wall 350. The barrier wall 350 may at least partially surround the members of the refractive layer 340. Some portions or no portions of the barrier wall 350 may be between the electrochromic layer 330 and the refractive layer 340. Some portions or no portions of the barrier wall 350 and between the refractive layer 340 and the second electrode 360. Because the refractive layer 340 is surrounded by the barrier wall 350, the first material 341 and the second material 343 included in the refractive layer 340 may not flow beyond the mask 300.

Members of the refractive layer 340 may respectively overlap and correspond to the areas of the electrochromic layer 330 and may respectively overlap and correspond to the areas of the substrate 310. For example, one member of the refractive layer 340 may correspond to one area/portion of electrochromic layer 330.

The second electrode 360 may be under the refractive layer 340 during a process of forming elements of the display apparatus 1. The second electrode 360 may have a mesh structure, analogous to the first electrode 320. The voltage may be applied to members of the electrochromic layer 330 respectively corresponding to the areas of the substrate 310 via the mesh structure of second electrode 360. The voltage may be applied to the refractive layer 340 via the first electrode 320 and/or the second electrode 360. The first electrode 320 and/or the second electrode 360 may be in direct contact with the refractive layer 340 when no portions of the barrier wall 350 intervene.

The second electrode 360 may be a transparent electrode. For example, the second electrode 360 may include at least one of indium tin oxide (ITO), indium zinc oxide (IZO), zinc oxide (ZnO), indium oxide ($In_2O_3$), indium gallium oxide (IGO), and aluminum zinc oxide (AZO).

Figure 4:
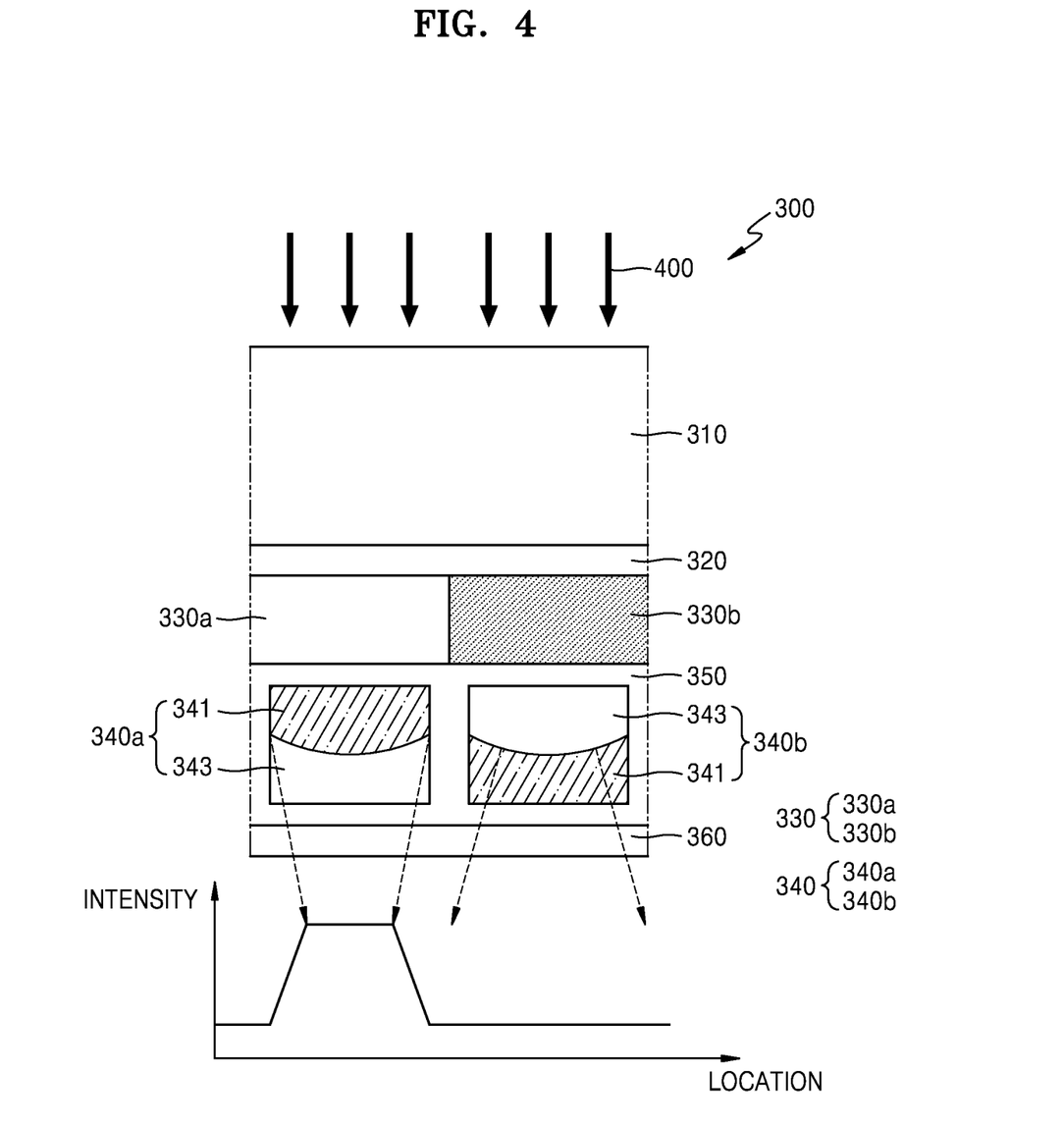
FIG. 4 is a cross-sectional view partially showing a mask according to an embodiment.

FIG. 4 is a cross-sectional view partially showing the mask 300 according to an embodiment. FIG. 4 illustrates that the electrochromic layer 330 transmits or blocks incident light and that the refractive layer 340 concentrates or disperses the incident light. In FIG. 4, like reference numerals as those of FIG. 3 denote analogous members or identical members.

Referring to FIG. 4, light 400 may be incident to the mask 300 via an exposure device. The light 400 incident into the mask 300 may be UV light including a UV ray. Because the substrate 310 transmits light, the light 400 incident into the mask 300 may transmit through the substrate 310. Because the first electrode 320 includes a transparent material, the light 400 transmitting through the substrate 310 may transmit through the first electrode 320.

The electrochromic layer 330 may include a first electrochromic layer/member 330a and a second electrochromic layer/member 330b. A member of the electrochromic layer 330 may transmit the incident light when receiving no (predetermined) voltage and may block the incident light when receiving a (predetermined) voltage. Each of the first electrochromic layer 330a and the second electrochromic layer 330b may transmit the incident light when receiving no (predetermined) voltage. Each of the first electrochromic layer 330a and the second electrochromic layer 330b may block the incident light when receiving a (predetermined) voltage.

In FIG. 4, a/the (predetermined) voltage is applied to the second electrochromic layer 330b via the first electrode 320 and/or the second electrode 360, and the second electrochromic layer 330b blocks the light, such that the second electrochromic layer 330b may function as a light-blocking layer.

In FIG. 4, when no (predetermined) voltage is applied to the first electrochromic layer 330a, the first electrochromic layer 330a may transmit the incident light.

The substrate 310 and the first electrode 320 may transmit the light 400 incident into the mask 300.

The light passing through the substrate 310 and the first electrode 320 may be partially transmitted through the first electrochromic layer 330a, but may be partially blocked by the second electrochromic layer 330b.

The refractive layer 340 may be under (and overlapped by) the electrochromic layer 330. In FIG. 4, the barrier wall 350 is between the electrochromic layer 330 and the refractive layer 340. The barrier wall 350 may not be positioned between the electrochromic layer 330 and the refractive layer 340; the electrochromic layer 330 and the refractive layer 340 may directly contact each other. In FIG. 4, portions of the barrier wall 350 are positioned between the refractive layer 340 and the second electrode 360. The barrier wall 350 may not be positioned between the refractive layer 340 and the second electrode 360. The refractive layer 340 may include a first refractive layer/member 340a and a second refractive layer/member 340b. The first refractive layer/member 340a may correspond to the first electrochromic layer/member 330a, and the second refractive layer/member 340b may correspond to the second electrochromic layer/member 330b.

The first refractive layer 340a and the second refractive layer 340b may each include a first material 341 having the first refractive index and include a second material 343 having the second refractive index that is different from the first refractive index.

When no (predetermined) voltage is applied to the refractive layer 340, the first material 341 may be on/above the second material 343, and the second material 343 may be under the first material 341. When the/a (predetermined) voltage is applied to the refractive layer 340, the first material 341 may move toward a side to which the voltage is applied. When the voltage is applied to the refractive layer 340 via the first electrode 320 and/or the second electrode 360, the first material 341 may be located adjacent to the second electrode 360.

The light transmitted through light-transmitting the first electrochromic layer 330a may be refracted by the first refractive layer 340a.

The first refractive index of the first material 341 may be less than the second refractive index of the second material 343. When the first material 341 is above the second material 343 and when the first material 341 is convex toward the second material 343, the light incident from the first material 341 to the second material 343 is refracted at an interface between the first material 341 and the second material 343 such that the light may be concentrated on a preset location. Therefore, an intensity of the light at the location where the light is concentrated may be increased.

In an embodiment, the first refractive index (of the first material 341) may be less than the second refractive index (of the second material 343). In this case, the first material 341 is on/above the second material 343, and the second material 343 may be convex upward. Because the first material 341 having less refractive index is on the second material 343 and the second material 343 is convex upward, the light incident from the first material 341 to the second material 343 may be refracted at the interface between the first material 341 and the second material 343 and may be concentrated on a preset location.

The/a (predetermined) voltage may be applied to the second electrochromic layer 330b and the second refractive layer 340b via the first electrode 320 and/or the second electrode 360. When the voltage is applied to the second electrochromic layer 330b, the second electrochromic layer 330b may block most of the light incident to the second electrochromic layer 330b, but may still transmit part of the light incident to the second electrochromic layer 330b.

The light transmitting through the light-blocking second electrochromic layer 330b may be refracted by the second refractive layer 340b. The second refractive layer 340b may include the first material 341 having the first refractive index and may include the second material 343 having the second refractive index that is different from the first refractive index. The first refractive index (of the first material 341) may be greater than the second refractive index (of the second material 343).

When the second material 343 is above/on the first material 341 and when the second material 343 is convex downward, the light incident from the second material 343 to the first material 341 may be refracted at the interface between the second material 343 and the first material 341, such that the light incident from the second material 343 to the first material 341 may be refracted and dispersed at the interface between the second material 343 and the first material 341. As a result, an intensity of the light at a location corresponding to the second electrochromic layer 330b may be reduced (degraded), such that a difference between the intensity of the light at the location of the display substrate 100 (see FIG. 2) where the light is substantially transmitted and the intensity of the light at the location of the display substrate 100 (see FIG. 2) where the light is significantly blocked may be further increased. Advantageously, a patterning accuracy (precision) may be improved, and a minimum line width may be minimized.

In an embodiment, the first refractive index (of the first material 341) may be less than the second refractive index (of the second material 343). In this case, the second material 343 is on/above the first material 341, and the first material 341 may be convex upward. Because the first material 341 having a lower refractive index is under the second material 343 and the first material 341 is convex upward, the light incident from the second material 343 to the first material 341 may be refracted and dispersed at the interface between the second material 343 and the first material 341.

Figure 5:
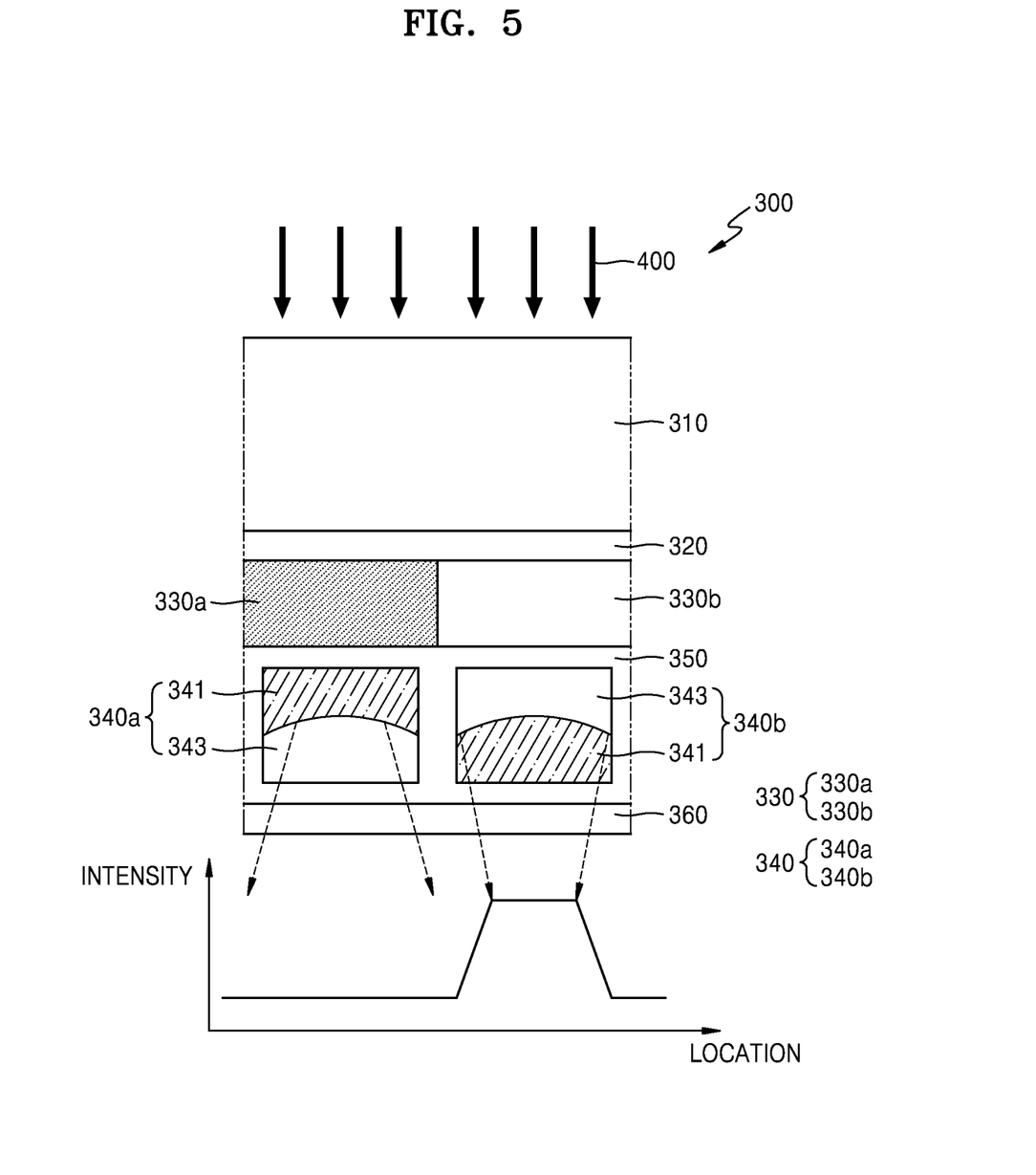
FIG. 5 is a cross-sectional view partially showing a mask according to an embodiment.

FIG. 5 is a cross-sectional view partially showing the mask 300 according to an embodiment. FIG. 5 illustrates that the electrochromic layer 330 transmits or blocks incident light and that the refractive layer 340 concentrates or disperses the incident light. In FIG. 5, like reference numerals as those of FIG. 4 denote analogous members or identical members.

The electrochromic layer 330 may include a first electrochromic layer/member 330a and a second electrochromic layer/member 330b. The electrochromic layer 330 may block the incident light when receiving no (predetermined) voltage and may transmit the incident light when receiving the/a (predetermined) voltage. Each of the first electrochromic layer 330a and the second electrochromic layer 330b may block the incident light when receiving no (predetermined) voltage. Each of the first electrochromic layer 330a and the second electrochromic layer 330b may transmit the incident light when receiving the/a (predetermined) voltage.

In FIG. 5, the/a (predetermined) voltage is applied to the second electrochromic layer 330b via the first electrode 320 and/or the second electrode 360, and the second electrochromic layer 330b transmits the light.

As shown in FIG. 5, when no (predetermined) voltage is applied to the first electrochromic layer 330a, the first electrochromic layer 330a may block the incident light and may function as a light-blocking layer.

The substrate 310 and the first electrode 320 transmit the light 400 incident into the mask 300, and the light transmitted through the substrate 310 and the first electrode 320 may be partially transmitted through the second electrochromic layer 330b but may be partially blocked by the first electrochromic layer 330a.

The refractive layer 340 may be under (and overlapped by) the electrochromic layer 330. The refractive layer 340 may include a first refractive layer/member 340a and a second refractive layer/member 340b. The first refractive layer 340a may correspond to the first electrochromic layer 330a, and the second refractive layer 340b may correspond to the second electrochromic layer 330b.

The first refractive layer 340a and the second refractive layer 340b may each include a first material 341 having the first refractive index and include a second material 343 having the second refractive index that is different from the first refractive index.

When no (predetermined) voltage is applied to the refractive layer 340, the first material 341 may be on/above the second material 343, and the second material 343 may be under the first material 341. When the/a (predetermined) voltage is applied to the refractive layer 340, the first material 341 may move toward a side to which the voltage is applied. For example, when the voltage is applied to the refractive layer 340 via the first electrode 320 and/or the second electrode 360, the first material 341 may be located adjacent to the second electrode 360.

Although the light incident into the light-blocking first electrochromic layer 330a is significantly blocked, there may be still light transmitted through the first electrochromic layer 330a.

The light transmitted through the light-blocking first electrochromic layer 330a may be refracted by the first refractive layer 340a. In the first refractive layer 340a, the first refractive index of the first material 341 may be greater than the second refractive index of the second material 343.

When the first material 341 is on/above the second material 343 and when the second material 343 is convex upward, the light incident from the first material 341 to the second material 343 may be refracted and dispersed at the interface between the first material 341 and the second material 343. Therefore, an intensity of the light at a location corresponding to the first electrochromic layer 330a may be reduced (degraded), such that a difference between the intensity of the light at the location where the light is significantly blocked and the intensity of the light at the portion where the light is not significantly blocked may be further increased. Given the increased light intensity difference on the display substrate 100 (see FIG. 2), a patterning accuracy (precision) may be improved, and a minimum line width for elements of the display apparatus 1 may be reduced.

The first refractive index of the first material 341 may be less than the second refractive index of the second material 343. In this case, the first material 341 is on the second material 343, and the first material 341 may be convex downward. Because the first material 341 having a lower refractive index is on/above the second material 343 and because the first material 341 is convex downward, the light incident from the first material 341 to the second material 343 may be refracted and dispersed at the interface between the first material 341 and the second material 343.

the/a (predetermined) voltage may be applied to the second electrochromic layer 330b and the second refractive layer 340b via the first electrode 320 and/or the second electrode 360. When the (predetermined) voltage is applied to the second electrochromic layer 330b, the second electrochromic layer 330b may transmit the light. The light transmitted through the second electrochromic layer 330b may be refracted by the second refractive layer 340b. In the first refractive layer 340a, the first refractive index of the first material 341 may be greater than the second refractive index of the second material 343.

When the first material 341 is under the second material 343 and when the first material 341 is convex upward, the light incident from the second material 343 into the first material 341 is refracted at the interface between the second material 343 and the first material 341 and may be concentrated onto a preset location. The light transmitting through the light-transmitting second electrochromic layer 330b may be refracted by the second refractive layer 340b and may be concentrated on the preset location. The intensity of the light at the location where the light is concentrated may be increased (improved).

The first refractive index of the first material 341 may be less than the second refractive index of the second material 343. In this case, the first material 341 is under the second material 343, and the second material 343 may be convex downward. Because the first material 341 having less refractive index is under the second material 343 and because the second material 343 is convex downward, the light incident from the second material 343 to the first material 341 may be refracted at the interface between the second material 343 and the first material 341 and may be concentrated at a preset location.

Figure 6:
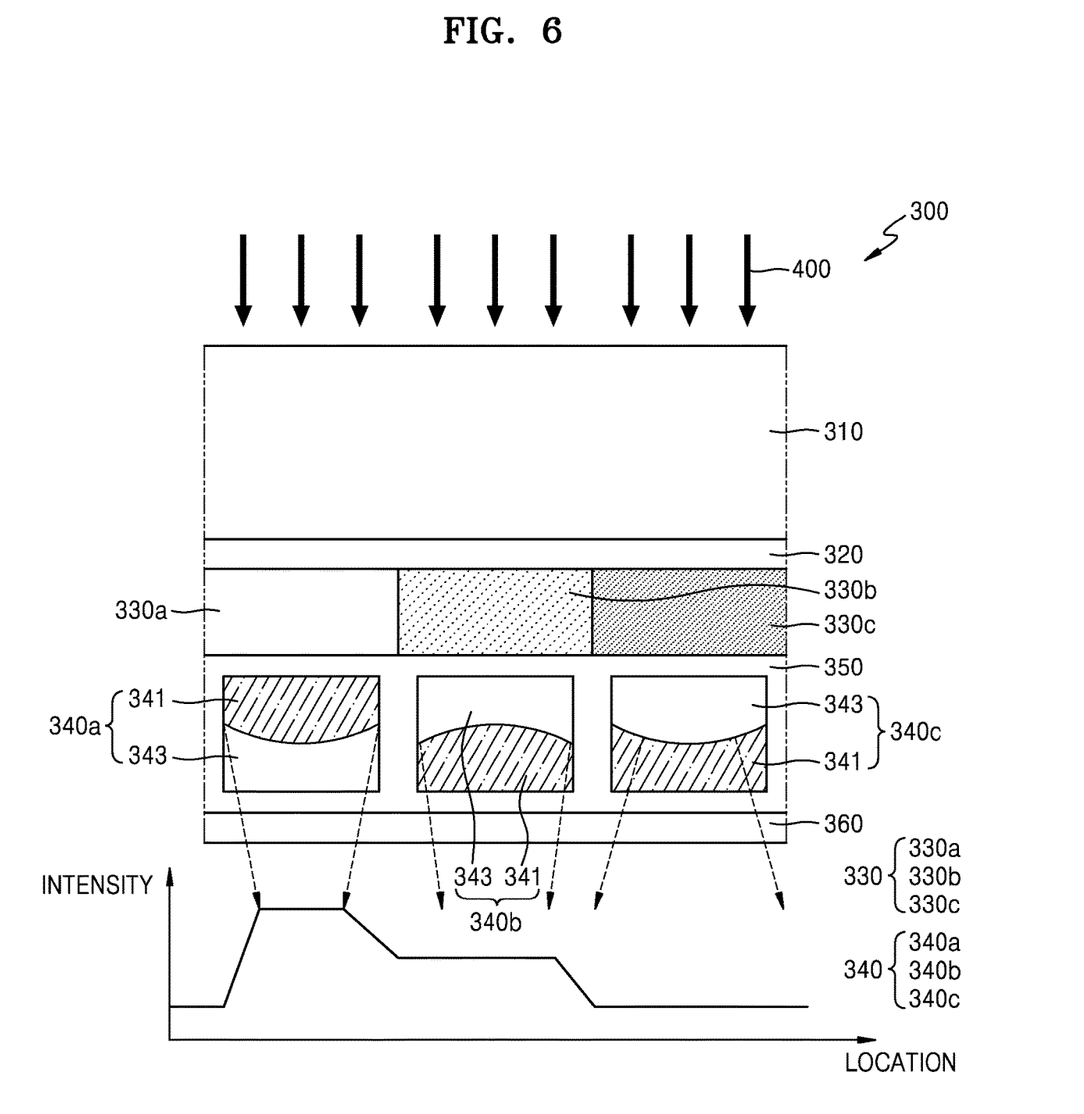
FIG. 6 is a cross-sectional view partially showing a mask according to an embodiment.

FIG. 6 is a cross-sectional view partially showing the mask 300 according to an embodiment. In FIG. 6, like reference numerals as those of FIG. 4 denote analogous members or identical members.

Referring to FIG. 6, light 400 may be incident to the mask 300 via an exposure device. The light 400 incident into the mask 300 may be a UV light including a UV ray. The light 400 incident into the mask 300 may be transmitted through the substrate 310 and the first electrode 320.

The electrochromic layer 330 may include a first electrochromic layer/member 330a, a second electrochromic layer/member 330b, and a third electrochromic layer/member 330c. The electrochromic layer 330 may transmit the incident light when receiving no (predetermined) voltage and may block the incident light when receiving the/a (predetermined) voltage. Each of the electrochromic layers 330a, 330b, and 330c may transmit incident light when receiving no (predetermined) voltage. When receiving the/a (predetermined) voltage, each of the electrochromic layers 330a, 330b, and 330c may block the incident light. The electrochromic layer 330 may be semi-transmissive/semi-transparent according to a magnitude of the received voltage.

In FIG. 6, the/a (predetermined) voltage is applied to the second electrochromic layer 330b via the first electrode 320 and/or the second electrode 360 such that the second electrochromic layer 330b is semi-transmissive/semi-transparent, and the/a (predetermined) voltage is applied to the third electrochromic layer 330c via the first electrode 320 and/or the second electrode 360 such that the third electrochromic layer 330c is substantially light-blocking.

In FIG. 6, when no (predetermined) voltage is applied to the first electrochromic layer 330a, the first electrochromic layer 330a may transmit the incident light. The/a (predetermined) voltage(s) may be applied to the electrochromic layers 330*b* and 330*c*. The second electrochromic layer 330*b* may be semi-transmissive (more light-blocking than the layer 330*a* and more light-transmitting than the layer 330*c*), and the third electrochromic layer 330*c* may be substantially light-blocking (more light-blocking than the layer 330*b*) according to the magnitude(s) of the voltage(s) applied via the first electrode 320 and/or the second electrode 360. The second electrochromic layer 330*b* may function as a semi-transmitting layer, and the third electrochromic layer 330*c* may function as a light-blocking layer.

The substrate 310 and the first electrode 320 may transmit the light 400 incident into the mask 300.

The light passing through the substrate 310 and the first electrode 320 may be substantially transmitted through the first electrochromic layer 330*a*, may be semi-transmitted through the second electrochromic layer 330*b*, and may be substantially blocked by the third electrochromic layer 330*c*.

The refractive layer 340 may be under (and overlapped by) the electrochromic layer 330 during a process of forming elements of the display apparatus 1. The refractive layer 340 may include a first refractive layer/member 340*a*, a second refractive layer/member 340*b*, and a third refractive layer/member 340*c*. The first refractive layer 340*a* may correspond to the first electrochromic layer 330*a*, the second refractive layer 340*b* may correspond to the second electrochromic layer 330*b*, and the third refractive layer 340*c* may correspond to the third electrochromic layer 330*c*.

The first refractive layer 340*a*, the second refractive layer 340*b*, and the third refractive layer 340*c* may each include a first material 341 having a first refractive index and include a second material 343 having a second refractive index that is different from the first refractive index.

When no (predetermined) voltage is applied to the refractive layer 340, the first material 341 may be on/above the second material 343 and the second material 343 may be under the first material 341. When the/a (predetermined) voltage is applied to the refractive layer 340, the first material 341 may move toward a side to which the voltage is applied. For example, when the voltage is applied to the refractive layer 340 via the first electrode 320 and/or the second electrode 360, the first material 341 may be located adjacent to the second electrode 360.

The light transmitted through the light-transmitting first electrochromic layer 330*a* may be refracted by the first refractive layer 340*a*. In the first refractive layer 340*a*, the first refractive index of the first material 341 may be greater than the second refractive index of the second material 343.

When the first material 341 is on/above the second material 343 and when the first material 341 is convex downward, the light incident from the first material 341 to the second material 343 is refracted at an interface between the first material 341 and the second material 343 such that the light may be concentrated on a preset location. The light transmitted through the first electrochromic layer 330*a* having the light-transmitting property may be refracted by the first refractive layer 340*a* and concentrated at a preset location. An intensity of the light at the location where the light is concentrated may be increased (improved).

The first refractive index of the first material 341 may be less than the second refractive index of the second material 343. In this case, the first material 341 is on the second material 343, and the second material 343 may be convex upward. Because the first material 341 having a lower refractive index is on the second material 343 and because the second material 343 is convex upward, the light incident from the first material 341 to the second material 343 may be refracted at the interface between the first material 341 and the second material 343 and concentrated on a preset location.

The/a (predetermined) voltage(s) may be applied to the second electrochromic layer 330*b* and the second refractive layer 340*b* via the first electrode 320 and/or the second electrode 360. When the (predetermined) voltage is applied to the second electrochromic layer 330*b*, the second electrochromic layer 330*b* may be semi-transmissive, such that some of the light incident to the second electrochromic layer 330*b* may be transmitted and that the other may be blocked.

The light transmitted through the semi-transmissive second electrochromic layer 330*b* may be refracted by the second refractive layer 340*b*. In the second refractive layer 340*b*, the first refractive index of the first material 341 may be greater than the second refractive index of the second material 343.

When the second material 343 is on the first material 341 and when the first material 341 is convex upward, the light incident from the second material 343 to the first material 341 may be refracted at the interface between the second material 343 and the first material 341 and may be concentrated onto a preset location. The light transmitted through the second electrochromic layer 330*b* is refracted by the second refractive layer 340*b* and concentrated on a preset location. The light intensity at the location corresponding to the second electrochromic layer 330*b* is less than the light intensity at the location corresponding to the first electrochromic layer 330*a*, but may be greater than that of the location corresponding to the third electrochromic layer 330*c*. In this case, a half-tone exposure may be performed on the display substrate 100 (see FIG. 2) at the location corresponding to the second electrochromic layer 330*b*.

The first refractive index of the first material 341 may be less than the second refractive index of the second material 343. In this case, the first material 341 is under the second material 343, and the second material 343 may be convex downward. Because the first material 341 having a lower refractive index is under the second material 343 and because the second material 343 is convex downward, the light incident from the second material 343 to the first material 341 may be refracted at the interface between the second material 343 and the first material 341 and may be concentrated at a preset location.

The/a (predetermined) voltage may be applied to the third electrochromic layer 330*c* and the third refractive layer 340*c* via the first electrode 320 and/or the second electrode 360. When the voltage is applied to the third electrochromic layer 330*c*, the third electrochromic layer 330*c* substantially blocks the light incident to the third electrochromic layer 330*c*, but some of the light may still be transmitted through the third electrochromic layer 330*c*.

The light transmitted through the light-blocking third electrochromic layer 330*c* may be refracted by the third refractive layer 340*c*. In the third refractive layer 340*c*, the first refractive index of the first material 341 may be greater than the second refractive index of the second material 343.

When the second material 343 is on the first material 341 and when the second material 343 is convex downward, the light incident from the second material 343 to the first material 341 may be refracted and dispersed at the interface between the second material 343 and the first material 341. When the light transmitted through the third electrochromic layer 330*c* is refracted and dispersed by the third refractive layer 340*c*, an intensity of the light at a location corresponding to the third electrochromic layer 330*c* may be reduced (degraded), such that a difference between the intensity of the light at the location where the light is substantially blocked and the intensity of the light at the location where the light is not substantially blocked may be further increased. Given the increased difference between light intensities on the display substrate 100 (see FIG. 2), a patterning accuracy (precision) may be improved, and a minimum line width of elements of the display apparatus 1 may be reduced.

The first refractive index of the first material 341 may be less than the second refractive index of the second material 343. In this case, the second material 343 is on/above the first material 341, and the first material 341 may be convex upward. Because the first material 341 having a lower refractive index is under the second material 343 and because the first material 341 is convex upward, the light incident from the second material 343 to the first material 341 may be refracted and dispersed at the interface between the second material 343 and the first material 341.

If an exposure process is performed using a mask including only a metal layer and/or an inorganic material layer, there is a limitation in reducing the minimum line width, and only one pattern may be obtained using one mask.

The exposure process may be performed by using the mask 300 including the electrochromic layer 330 including the electrochromic material and/or the refractive layer 340, and characteristics of the mask may be changed by applying a voltage. Thus, various shapes may be patterned by using one mask. Accordingly, cost and/or time required for replacing masks may not be necessary. Advantageously, equipment operating efficiency may be maximized, and/or manufacturing cost for display apparatuses may be minimized.

Embodiments (e.g., the mask 300) may increase the differences of light intensities at different locations. Advantageously, patterning accuracy (precision) may be improved, and minimum line widths of elements of display apparatuses may be reduced, such the resolutions of the display apparatuses may be maximized.

Figure 7:
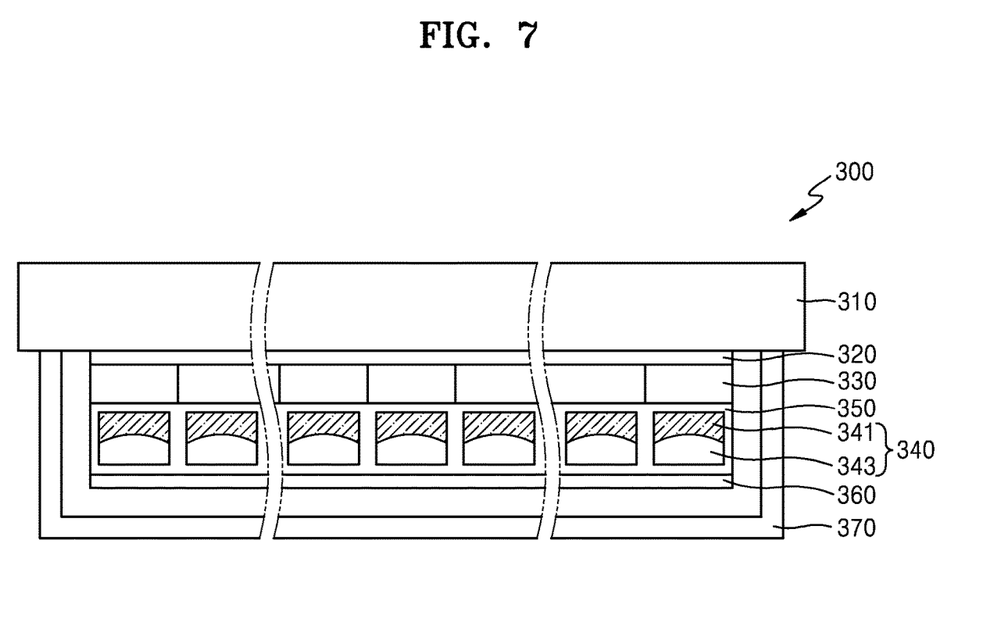
FIG. 7 is a cross-sectional view partially showing a mask according to an embodiment.

FIG. 7 is a cross-sectional view partially showing the mask 300 according to an embodiment. The embodiment of FIG. 7 is different from that of FIG. 3 in that the mask 300 further includes a pellicle 370. In FIG. 7, like reference numerals as those of FIG. 3 denote analogous members or identical members.

Referring to FIG. 7, the mask 300 may further include the pellicle 370. The pellicle 370 may be attached to a part of the mask 300 via an adhesive. The pellicle 370 may include a light-transmitting material. For example, the pellicle 370 may have a transmittance of 80% or greater, or 90% or greater.

The pellicle 370 may surround the first electrode 320, the electrochromic layer 330, the refractive layer 340, and/or the second electrode 360. The pellicle 370 may protect the first electrode 320, the electrochromic layer 330, the refractive layer 340, and/or the second electrode 360 against external impurities. The pellicle 370 may be spaced from the second electrode 360.

When the pellicle 370 is included in some part of the mask 300, the lifespan of the mask 300 may increase (improved), a cleaning cycle of the mask 300 may be reduced, and defects resulted from the exposure process may be minimized.

Figure 8:
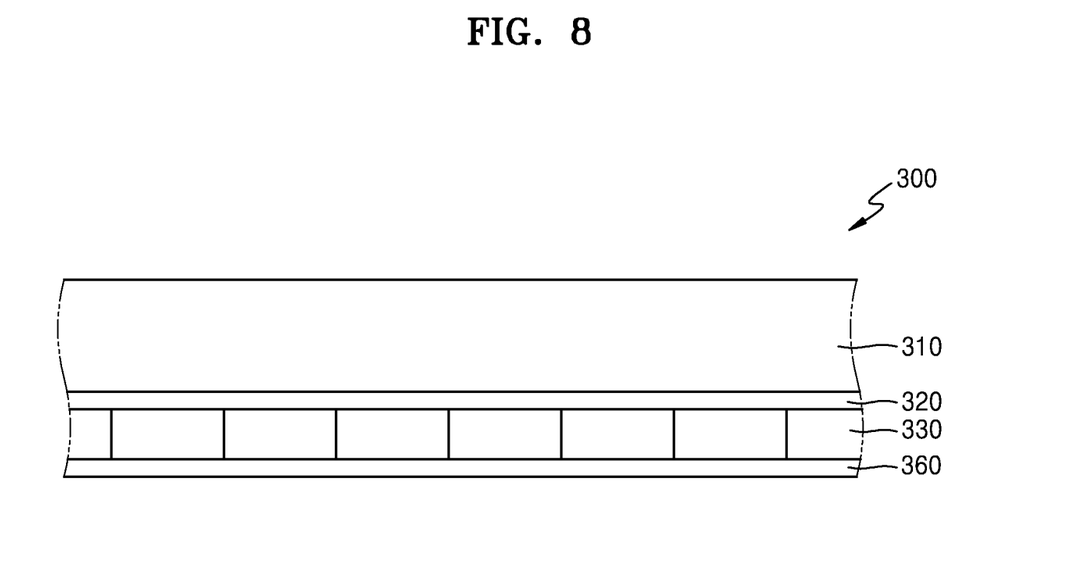
FIG. 8 is a cross-sectional view partially showing a mask according to an embodiment.

FIG. 8 is a cross-sectional view partially showing the mask 300 according to an embodiment. In FIG. 8, like reference numerals as those of FIG. 3 denote analogous members or identical members.

Referring to FIG. 8, the mask 300 may include the substrate 310, the first electrode 320, the electrochromic layer 330, and the second electrode 360.

The electrochromic layer 330 may be under the substrate 310. The electrochromic layer 330 may be patterned to include separate members respectively corresponding to areas of the substrate 310. The electrochromic layer 330 may be an integral member or may include integrally provided members.

The electrochromic layer 330 may transmit the incident light when receiving no (predetermined) voltage and may block the incident light when receiving a/the (predetermined) voltage.

When the mask 300 includes the electrochromic layer 330 including the electrochromic material, the characteristics of the mask 300 (e.g., the structure or pattern enabled by the mask 300) may be changed by applying the/a (predetermined) voltage to the electrode 320 and/or the electrode 360. Thus, various structures may be patterned using one mask. Advantageously, cost and time for manufacturing elements of display apparatuses may be minimized.

Figure 9:
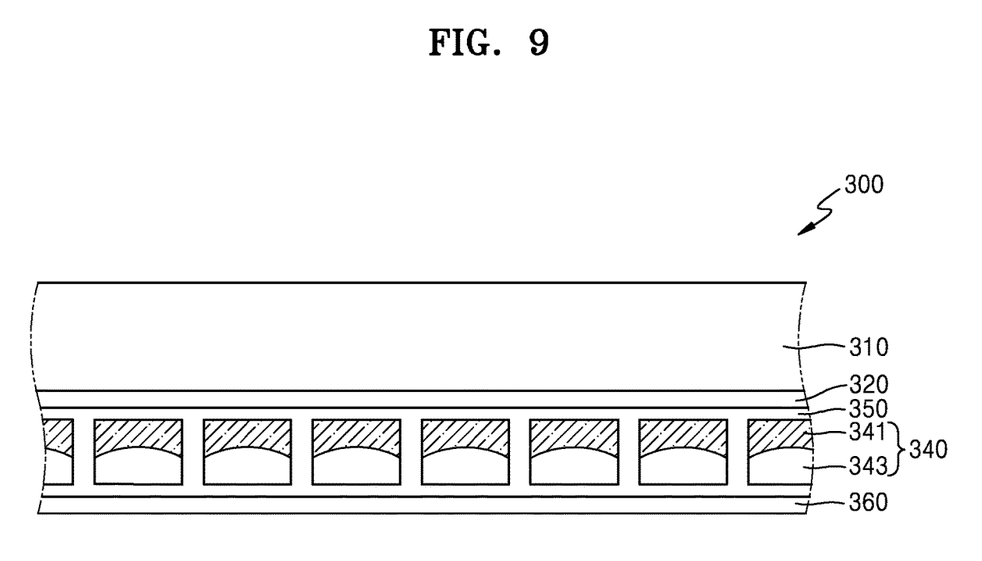
FIG. 9 is a cross-sectional view partially showing a mask according to an embodiment.

FIG. 9 is a cross-sectional view partially showing the mask 300 according to an embodiment. In FIG. 9, like reference numerals as those of FIG. 3 denote analogous members or identical members.

Referring to FIG. 9, the mask 300 may include the substrate 310, the first electrode 320, the refractive layer 340, the barrier wall 350, and the second electrode 360.

The refractive layer 340 may be under and overlapped by the substrate 310 (during a process of forming elements of a display apparatus). The refractive layer 340 may be patterned to include separate members respectively corresponding to areas of the substrate 310. The refractive layer 340 may be an integral member or may include integrally provided members.

The refractive layer 340 may concentrate or disperse the light. The refractive layer 340 may include a first material 341 having a first refractive index, and a second material having a second refractive index that is different from (i.e., unequal to) the first refractive index. The first refractive index of the first material 341 may be greater than the second refractive index of the second material 343. The first refractive index of the first material 341 may be less than the second refractive index of the second material 343.

The refractive layer 340 may be surrounded by the barrier wall 350. Because the refractive layer 340 is surrounded by the barrier wall 350, potential leakage of the first material 341 and the second material 343 included in the refractive layer 340 may be prevented.

The refractive layer 340 may increase the difference between the light intensity at the location where the light is not significantly blocked and the light intensity at the location where the light is significantly blocked. Advantageously, the patterning accuracy (precision) may be improved, and minimum line widths of display apparatus components may be reduced.

According to embodiments, a mask includes an electrochromic layer (including the electrochromic material) and/or a refractive layer. Advantageously, various structures may be formed using only one mask.

The described example embodiments should be considered in an illustrative sense and not for purposes of limitation. Descriptions of features or aspects within an embodiment may be applicable for features or aspects in other embodiments. Various changes in form and details may be made in the described example embodiments without departing from the scope defined by the following claims.

What is claimed is:

1. A mask comprising:
   a substrate;
   an electrochromic layer including an electrochromic material, wherein the substrate and the electrochromic layer overlap each other; and
   a refractive layer including a first material and a second material,
   wherein the electrochromic layer is positioned between the substrate and the refractive layer,
   wherein first material, the second material, and the substrate overlap each other,
   wherein the first material has a first refractive index,
   wherein the second material has a second refractive index unequal to the first refractive index,
   wherein the refractive layer comprises a first refractive member and a second refractive member that are equidistant from the substrate,
   wherein the first refractive member concentrates first light that has passed through the electrochromic layer, and
   wherein the second refractive member disperses second light that has passed through the electrochromic layer.

2. The mask of claim 1, further comprising a first electrode positioned between the substrate and the electrochromic layer.

3. The mask of claim 2, wherein the first electrode directly contacts the electrochromic layer.

4. The mask of claim 2, further comprising a second electrode, wherein the electrochromic layer is positioned between the first electrode and the second electrode, wherein the first electrode comprises a first transparent electrode, and wherein the second electrode comprises a second transparent electrode.

5. The mask of claim 4, further comprising a pellicle surrounding the second electrode.

6. The mask of claim 5, wherein the pellicle is spaced from the second electrode.

7. The mask of claim 1, wherein the electrochromic layer comprises a first electrochromic member and a second electrochromic member that are equidistant from the substrate, wherein the first electrochromic member transmits a first portion of incident light, and wherein the second electrochromic member blocks a second portion of the incident light.

8. The mask of claim 1, further comprising a barrier wall surrounding at least a part of the refractive layer.

9. A mask comprising:
   a substrate;
   a refractive layer comprising a first material and a second material, wherein the first material, the second material, and the substrate overlap each other, wherein the first material has a first refractive index, and wherein the second material has a second refractive index unequal to the first refractive index;
   a barrier wall surrounding at least a part of the refractive layer; and
   an electrochromic layer positioned between the substrate and the refractive layer and including an electrochromic material,
   wherein the electrochromic layer comprises a first electrochromic member and a second electrochromic member that are equidistant from the substrate,
   wherein the first electrochromic member transmits a first portion of incident light,
   wherein the second electrochromic member blocks a second portion of the incident light,
   wherein the refractive layer comprises a first refractive member and a second refractive member that are equidistant from the substrate,
   wherein the first refractive member concentrates first light that has passed through the electrochromic layer, and
   wherein the second refractive member disperses second light that has passed through the electrochromic layer.

10. The mask of claim 9, further comprising:
    a first electrode positioned between the substrate and the electrochromic layer; and
    a second electrode, wherein the refractive layer is positioned between the first electrode and the second electrode.

11. The mask of claim 10, wherein the first electrode comprises a first transparent electrode, and wherein the second electrode comprises a second transparent electrode.

12. The mask of claim 10, wherein the first electrode directly contacts the electrochromic layer.

13. The mask of claim 10, further comprising a pellicle surrounding the second electrode.

14. The mask of claim 13, wherein the pellicle is spaced from the second electrode.

* * * * *